United States Patent
Yan et al.

(10) Patent No.: US 10,439,070 B2
(45) Date of Patent: Oct. 8, 2019

(54) THIN-FILM TRANSISTOR (TFT) AND MANUFACTURING METHOD THEREOF

(71) Applicants: BOE TECHNOLOGY GROUP CO., LTD., Beijing (CN); SOUTH CHINA UNIVERSITY OF TECHNOLOGY, Guangzhou, Guangdong (CN)

(72) Inventors: Liangchen Yan, Beijing (CN); Guangcai Yuan, Beijing (CN); Xiaoguang Xu, Beijing (CN); Lei Wang, Beijing (CN); Junbiao Peng, Beijing (CN); Linfeng Lan, Beijing (CN)

(73) Assignees: BOE TECHNOLOGY GROUP CO., LTD., Beijing (CN); SOUTH CHINA UNIVERSITY OF TECHNOLOGY, Guangzhou, Guangdong (CN)

( * ) Notice: Subject to any disclaimer, the term of this patent is extended or adjusted under 35 U.S.C. 154(b) by 0 days.

(21) Appl. No.: 15/515,004

(22) PCT Filed: May 11, 2016

(86) PCT No.: PCT/CN2016/081696
§ 371 (c)(1),
(2) Date: Mar. 28, 2017

(87) PCT Pub. No.: WO2017/133114
PCT Pub. Date: Aug. 10, 2017

(65) Prior Publication Data
US 2018/0090601 A1    Mar. 29, 2018

(30) Foreign Application Priority Data
Feb. 3, 2016 (CN) .......................... 2016 1 0076318

(51) Int. Cl.
*H01L 29/786* (2006.01)
*H01L 29/51* (2006.01)
(Continued)

(52) U.S. Cl.
CPC ........ *H01L 29/7869* (2013.01); *C23C 14/165* (2013.01); *C23C 14/185* (2013.01);
(Continued)

(58) Field of Classification Search
CPC ............. H01L 29/7869; H01L 29/4908; H01L 29/517; H01L 21/02614; H01L 21/02244; H01L 21/02258; C25D 11/022
See application file for complete search history.

(56) References Cited

U.S. PATENT DOCUMENTS 8,497,502 B2 * 7/2013 Yaegashi ............. H01L 29/7869
257/43
2011/0017989 A1 * 1/2011 Chen .................... H01L 27/1225
257/43
(Continued)

FOREIGN PATENT DOCUMENTS

CN    104282576 A    1/2015
CN    104299915 A    1/2015
(Continued)

OTHER PUBLICATIONS

International Search Report and Written Opinion dated Oct. 26, 2016; PCT/CN2016/081696.
(Continued)

*Primary Examiner* — Bac H Au

(57) ABSTRACT

A thin-film transistor (TFT) and a manufacturing method thereof. The manufacturing method for the TFT includes: depositing metal film layers on a substrate by a direct current (DC) sputtering method; and forming a metal oxide film layer or metal oxide film layers by completely oxidizing or
(Continued)

partially oxidizing the metal film layers. The TFT includes a gate electrode layer and a gate insulating layer which are tightly integrated.

16 Claims, 2 Drawing Sheets

(51) Int. Cl.

| | |
|---|---|
| C23C 14/18 | (2006.01) |
| C23C 14/20 | (2006.01) |
| C23C 14/58 | (2006.01) |
| C25D 11/02 | (2006.01) |
| C25D 11/04 | (2006.01) |
| C25D 11/26 | (2006.01) |
| C25D 11/34 | (2006.01) |
| H01L 21/02 | (2006.01) |
| H01L 21/443 | (2006.01) |
| H01L 29/24 | (2006.01) |
| H01L 29/49 | (2006.01) |
| H01L 29/66 | (2006.01) |
| C23C 14/16 | (2006.01) |

(52) U.S. Cl.
CPC ........ *C23C 14/205* (2013.01); *C23C 14/5853* (2013.01); *C25D 11/022* (2013.01); *C25D 11/04* (2013.01); *C25D 11/26* (2013.01); *C25D 11/34* (2013.01); *H01L 21/0223* (2013.01); *H01L 21/02422* (2013.01); *H01L 21/02565* (2013.01); *H01L 21/02614* (2013.01); *H01L 21/443* (2013.01); *H01L 29/24* (2013.01); *H01L 29/4908* (2013.01); *H01L 29/517* (2013.01); *H01L 29/66969* (2013.01); *H01L 29/786* (2013.01); *H01L 29/78603* (2013.01); *H01L 29/78606* (2013.01); *H01L 29/78693* (2013.01); *H01L 21/02244* (2013.01); *H01L 21/02258* (2013.01)

(56) References Cited

U.S. PATENT DOCUMENTS

| | | | |
|---|---|---|---|
| 2014/0011329 A1* | 1/2014 | Zhang | H01L 29/66969 438/158 |
| 2016/0043227 A1* | 2/2016 | Zhang | H01L 29/7869 257/43 |
| 2017/0256421 A1* | 9/2017 | Liu | H01L 21/02244 |
| 2017/0316953 A1* | 11/2017 | Zhang | H01L 21/28 |
| 2017/0317195 A1* | 11/2017 | Zhang | H01L 21/28 |

FOREIGN PATENT DOCUMENTS

| | | |
|---|---|---|
| CN | 105161423 A | 12/2015 |
| CN | 105529275 A | 4/2016 |
| JP | 2009-094535 A | 4/2009 |
| JP | 2010-258206 A | 11/2010 |

OTHER PUBLICATIONS

The First Chinese Office Action dated Jul. 31, 2017; Appln. No. 201610076318.7.

* cited by examiner

THIN-FILM TRANSISTOR (TFT) AND MANUFACTURING METHOD THEREOF

TECHNICAL FIELD

The present disclosure relates to a thin-film transistor (TFT) and a manufacturing method thereof.

BACKGROUND

In recent years, the novel flat panel display (FPD) industry has developed with each passing day. Consumers' high requirements on large-size and high-resolution FPDs stimulate the entire industry to continuously improve the display technology. TFT backplane technology, which is regarded as the core technology of the FPD industry, also undergoes profound evolutions. Oxide TFT not only shows high migration but also shows simple manufacturing process, low production cost and superior large-area uniformity. Therefore, oxide TFT technology has attracted much industry attention since the birth.

SUMMARY

Embodiments of the present disclosure provide a manufacturing method of a thin-film transistor (TFT), comprising: depositing metal film layers on a substrate by a direct current (DC) sputtering method; and forming a metal oxide film layer or metal oxide film layers by completely oxidizing or partially oxidizing the metal film layers.

In one embodiment of the present disclosure, for example, after depositing the metal film layers on the substrate by the DC sputtering method and before forming the metal oxide film layer or metal oxide film layers by completely oxidizing or partially oxidizing the metal film layers, the method further comprises patterning the metal film layers.

In one embodiment of the present disclosure, for example, after forming the metal oxide film layer or metal oxide film layers by completely oxidizing or partially oxidizing the metal film layers, the method further comprises patterning the metal oxide film layer or metal oxide film layers.

In one embodiment of the present disclosure, for example, depositing the metal film layers on the substrate by the DC sputtering method comprises: depositing a first metal film layer on the substrate by a DC sputtering method; and depositing a second metal film layer on the first metal film layer by a DC sputtering method.

In the method of one embodiment of the present disclosure, for example, forming the metal oxide film layer or metal oxide film layers by completely oxidizing or partially oxidizing the metal film layers comprises: completely oxidizing the second metal film layer to form a second metal oxide film layer, oxidizing a surface of the first metal film layer to form a first metal oxide film layer, and obtaining an unoxidized part of the first metal film layer as a third metal film layer, in which the first metal oxide film layer covers the third metal film layer.

In one embodiment of the present disclosure, for example, after forming the metal oxide film layer or metal oxide film layers by completely oxidizing or partially oxidizing the metal film layers, the method further comprises patterning the second metal oxide film layer.

In the method of one embodiment of the present disclosure, for example, a temperature of the substrate is the same as ambient temperature.

In the method of one embodiment of the present disclosure, for example, the first metal film layer comprises aluminum, tantalum, titanium or alloy of any two or three of aluminum, tantalum and titanium.

In the method of one embodiment of the present disclosure, for example, the second metal film layer comprises zinc, tin, indium or alloy of any two or three of zinc, tin and indium.

In the method of one embodiment of the present disclosure, for example, the third metal film layer is a gate electrode layer; the first metal oxide film layer is a gate insulating layer; and the second metal oxide film layer is an active layer.

In the method of one embodiment of the present disclosure, for example, the substrate is a flexible substrate.

In the method of one embodiment of the present disclosure, for example, the flexible substrate comprises polyethylene naphthalate (PEN), polyethylene terephthalate (PET), polyimide (PI) or metal foil.

In the method of one embodiment of the present disclosure, for example, a thickness of the third metal film layer is from 100 nm to 1,000 nm; a thickness of the second metal film layer is from 10 nm to 200 nm; and a thickness of the first metal oxide film layer is from 50 nm to 400 nm.

In one embodiment of the present disclosure, for example, the method further comprises forming a water-oxygen barrier layer or a buffer layer on a side opposite to the metal film layers.

In the method of one embodiment of the present disclosure, for example, the water-oxygen barrier layer or the buffer layer comprises silicon oxide, silicon nitride, silicon oxynitride or alumina.

An embodiment of the present disclosure provide a thin film transistor (TFT), comprising: a substrate, and a gate electrode layer, a gate insulating layer and an active layer disposed on the substrate in sequence, wherein the gate electrode layer and the gate insulating layer comprise same metallic elements.

In one embodiment of the present disclosure, for example, in the TFT, the gate electrode layer and the gate insulating layer are integrally formed.

In one embodiment of the present disclosure, for example, in the TFT, the gate insulating layer is configured as an oxidized surface of the gate electrode layer, and the gate insulating layer covers an upper surface and side surfaces of the gate electrode layer.

In one embodiment of the present disclosure, for example, in the TFT, a pattern of the gate insulating layer is the same as a pattern of the active layer.

In one embodiment of the present disclosure, for example, in the TFT, a size of a pattern of the gate insulating layer is greater than a size of a pattern of the active layer.

BRIEF DESCRIPTION OF THE DRAWINGS in order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Oxide semiconductors have the advantages such as high carrier migration, transparent to visible light, etc., and have a tendency to replace TFTs manufactured by the traditional silicon technology in the field of TFT substrates of FPDs. However, as oxide semiconductor active layers have low electrical conductivity, they are usually manufactured by radio frequency (RF) sputtering method. Compared with DC sputtering, RF sputtering has the defects of low speed, matching requirement, poor process repetitiveness, uneven compositions of multi-element films, high RF radiation, etc. Therefore, industrial production usually does not adopt RF sputtering. In addition, an insulating layer and semiconductor active layers have high process temperature and cannot be compatible with a flexible substrate. The embodiments of the present invention provide the following proposal in order to solve the problems.

Figure 1A:
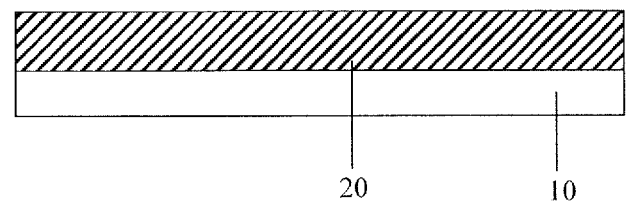
FIGS. 1a to 1e are schematic diagrams illustrating the processes of manufacturing a TFT by a DC sputtering method in the embodiments of the present invention.

FIGS. 1a to 1e and FIG. 2 illustrate the manufacturing process of a TFT provided by one embodiment of the present invention. As illustrated in FIG. 1a, a first metal film layer 20 is deposited on a substrate 10 by a DC sputtering method. A material of the first metal film layer 20 is aluminum. It should be noted that the material of the first metal film layer 20 is not limited to aluminum in the embodiment and may be any metallic material which can be taken as a gate electrode, for example, aluminum, tantalum, titanium or alloy of any two or three of aluminum, tantalum and titanium. DC sputtering is a method in which a direct current supply is adopted for magnetron sputtering deposition of a film. In the present embodiment, DC sputtering adopts Ar gas plasmas; the sputtering pressure is from 0.1 Pa to 3 Pa; and the power of the direct current supply is from 200 W to 5,000 W. In the operation process of DC sputtering, it is not necessary to heat the substrate 10. For instance, in the film forming process and the subsequent processes, a temperature of the substrate 10 is the same as the ambient temperature. For instance, the ambient temperature may be from 15° C. to 35° C., or for instance, is 25° C. Because the temperature of the substrate is low in the DC sputtering process, the substrate 10 may be a flexible substrate. For instance, a material of the flexible substrate may be polyethylene naphthalate (PEN), polyethylene terephthalate (PET), polyimide (PI) or metal foil.

Figure 1B:
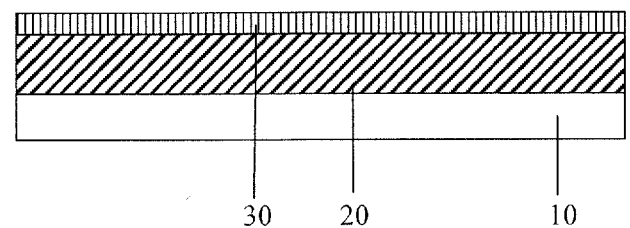

As illustrated in FIG. 1b, a second metal film layer 30 is deposited on the first metal film layer 20 by a DC sputtering method. The second metal film layer 30 comprises zinc. It should be noted that the metallic material in the second metal film layer 30 is not limited to zinc in the present embodiment and may be any metallic material which can be taken as a semiconductor active layer after oxidation, for instance, zinc, tin, indium or alloy of any two or three of zinc, tin and indium.

Figure 1C:
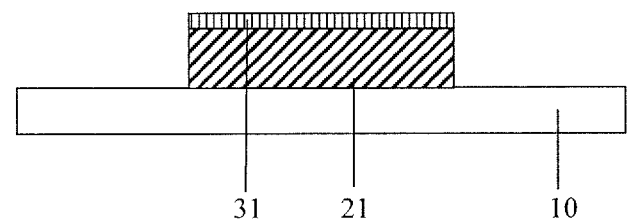

As illustrated in FIG. 1c, the first metal film layer 20 and the second metal film layer 30 are patterned to form a patterned first metal film layer 21 and a patterned second metal film layer 31. As the patterning is completed using one mask in one single patterning process, the first metal film layer 21 and the second metal film layer 31 have same patterns.

Figure 1D:
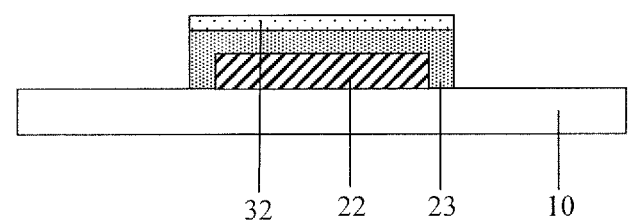

As illustrated in FIG. 1d, the first metal film layer 21 and the second metal film layer 31 are oxidized, so that the second metal film layer 31 is completely oxidized into a second metal oxide film layer 32, and the first metal film layer 21 is partially oxidized to form (1) a third metal film layer 22 which is not oxidized and (2) a first metal oxide film layer 23 which covers the third metal film layer 22. Because both the third metal film layer 22 and the first metal oxide film layer 23 constitute one part of the first metal film layer 21 before oxidization, it should be understood that the third metal film layer 22 makes firm connection with the first metal oxide film layer 23. In addition, the third metal film layer 22 and the first metal oxide film layer 23 comprise the same metallic elements. In the present embodiment, the third metal film layer 22 functions as a gate electrode layer, and the first metal oxide film layer 23 functions as a gate insulating layer. In the conventional manufacturing method, a gate electrode layer is deposited firstly, and then a gate insulating layer is deposited on the gate electrode layer. Because defects or gaps may exist in a contact surface between the two layers, the insulating effect can be harmed. Moreover, the gate insulating layer cannot be too thin. In contrast, in the embodiments of the present invention, as described above, the third metal film layer 22 and the first metal oxide film layer 23 which are integrally formed make direct contact and firm connection with each other, and there are fewer gaps or defects between the first metal oxide film layer 23 functioning as the gate insulating layer and the third metal film layer 22 functioning as the gate electrode layer, so that the insulating effect can be greatly improved. Moreover, the first metal oxide film layer 23 functioning as the gate insulating layer may also be manufactured to be relatively thin. Because the first metal oxide film layer 23 is formed by oxidizing a surface of the first metal film layer 21, it should be understood that the first metal oxide film layer 23 covers an upper surface and side surfaces of the third metal film layer 22. As shown in FIG. 1d, a surface of the third metal film layer 22 that makes contact with the substrate 10 is the lower surface of the third metal film layer 22; a surface opposite to the lower substrate is an upper surface; and other surfaces except the upper surface and the lower surface are side surfaces.

For instance, a thickness of the first metal oxide film layer 23 may be from 50 nm to 400 nm, from 50 nm to 200 nm or from 80 nm to 160 nm. In order to ensure that the third metal film layer 22 is thick enough to function as the gate electrode layer after oxidation, a thickness of the first metal film layer 20/21 before oxidation is generally set to be from 100 nm to 1,000 nm. After oxidation, a thickness of the third metal film layer 22 functioning as the gate electrode layer is usually from 50 nm to 800 nm, from 100 nm to 600 nm or from 150 nm to 300 nm. In the embodiments of the present invention, the oxidation method is not particularly limited, and methods commonly used in the art such as chemical oxidation and electrochemical oxidation may be adopted. For instance, annealing may be performed in an oxygen-containing atmosphere, or ion implantation is performed in oxygen plasmas, or oxidation is performed by plasma treatment. Taking electrochemical oxidation as an example, the operation processes are: one end of a substrate that is immersed into an electrolytic solution is connected with a power supply anode, and a power supply cathode is connected with the other end of the substrate or graphite and is electrified for oxidation.

Figure 1E:
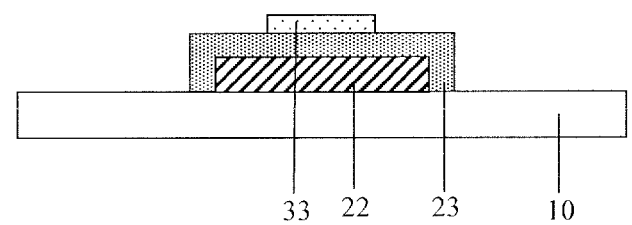

As illustrated in FIG. 1e, the second metal oxide film layer 32 is patterned to form a patterned second metal oxide film layer 33. As described above, the material of the second metal film layer 30, for instance, may be zinc, tin, indium or alloy of any two or three of zinc, tin and indium. Correspondingly, the material of the second metal oxide film layer 33, for instance, is zinc oxide, tin oxide, indium oxide or composite oxide of any two or three of zinc, tin and indium. The composite oxide, for instance, may be indium tin oxide (ITO), indium zinc oxide (IZO), etc. The second metal oxide film layer 33 which is a semiconductor may function as an active layer.

Figure 2:
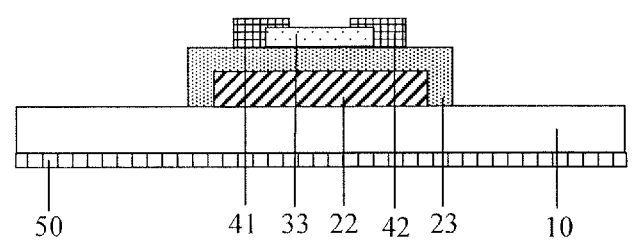
FIG. 2 is a schematic structural view of a TFT provided by one embodiment of the present invention.

Finally, as shown in FIG. 2, an electrode layer is formed on the second metal oxide film layer 33 by a DC sputtering method, and is patterned to form a source electrode 41 and a drain electrode 42. The materials of the source electrode 41 and the drain electrode 42 are conductive materials, may be metallic materials such as aluminum, copper, molybdenum, titanium, silver, gold, tantalum, tungsten, chrome elements or aluminum alloy, may be metal oxide such as ITO and aluminum-doped zinc oxide (AZO), and may also be a multilayer film formed by several above films. The total thickness is, for instance, from 100 nm to 2,000 nm.

Figure 3:
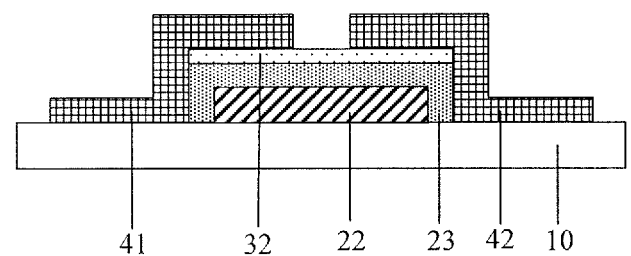
FIG. 3 is a schematic structural view of a TFT provided by another embodiment of the present invention.

In the embodiments as shown in FIGS. 1a to 1e and FIG. 2, the second patterning process as shown in FIG. 1e may be omitted. That is to say, after the oxidation process as shown in FIG. 1d, the electrode layer is directly formed on the second metal oxide film layer 32 by a DC sputtering method, and is patterned to form the source electrode 41 and the drain electrode 42, and a TFT with the device structure as shown in FIG. 3 is obtained. As the second patterning process is omitted, a pattern of the second metal oxide film layer 32 functioning as the active layer is the same as a pattern of the first metal oxide film layer 23 functioning as the gate insulating layer. In the device structure as shown in FIG. 2, due to the second patterning process, a size of the pattern of the second metal oxide film layer 32 functioning as the active layer is less than a size of the pattern of the first metal oxide film layer 23 functioning as the gate insulating layer.

For instance, as shown in FIG. 2, a water-oxygen barrier layer or a buffer layer 50 may also be disposed on the outside of the substrate 10, namely the other side opposite to the side deposited with the metal film layers.

A material of the water-oxygen barrier layer or the buffer layer 50, for instance, may be silicon oxide, silicon nitride, silicon oxynitride or alumina.

For instance, an etching barrier layer may also be disposed on the oxide active layer 32, so as to avoid the damage on the oxide active layer 32 at a channel of the TFT in the process of etching the source/drain electrodes. In addition, a passivation layer may also be disposed on the source/drain electrodes 41/42.

It should be noted that description is given in the above embodiments by taking the deposition of two metal film layers as an example, but the embodiments of the present invention is not limited thereto. In the embodiments of the present invention, one metallic film may be formed by DC sputtering and oxidized, or more than three metallic films are continuously formed and oxidized. The formed oxide layer is also not limited to the active layer or the gate insulating layer of the TFT, and may be any other appropriate oxide layer.

The method for manufacturing the TFT, provided by the embodiment of the present invention, makes it possible to manufacture the TFT by a DC sputtering method. Because oxide in the TFT is semiconductor or insulator, before the present invention, it is generally considered that the TFT cannot be directly manufactured by a DC sputtering method. RF sputtering method is usually adopted in the art to manufacture TFTs. However, RF sputtering has the defects such as low speed, matching requirement, poor process repetitiveness, uneven compositions of multielement films and high RF radiation. The inventors of the present invention adopt DC sputtering to form metal layers firstly, and then oxidize the metal layers to form metal oxide semiconductor layers or metal oxide insulating layers, and cleverly solves the problem that the TFT cannot be directly manufactured by the DC sputtering method. On one hand, the above defects of RF sputtering can be avoided. On the other hand, the adoption of the DC sputtering method improves the film forming rate, has the advantages of non-radiation and low cost, improves the process repetitiveness, and meanwhile, can also effectively reduce oxygen vacancy. In addition, when TFTs are manufactured by the traditional RF sputtering method, as the insulating layer and the semiconductor active layer have high process temperature, a flexible substrate cannot be used. But the problem can be solved when TFTs are manufactured by the DC sputtering method provided by the embodiments of the present invention. Because the temperature of the substrate will not be obviously raised in the process of depositing the metallic films on the substrate by a DC sputtering method, a flexible substrate may be used.

The embodiments of the present invention further provide a TFT manufactured by DC sputtering method. As illustrated in FIG. 2, the embodiment of the present invention provides a TFT, which comprises a substrate 10, and a gate electrode layer 22, a gate insulating layer 23, a semiconductor active layer 33, a source electrode 41 and a drain electrode 42 which are formed on the substrate 10 in sequence. A size of a pattern of the semiconductor active layer 33 is less than a size of a pattern of the gate insulating layer 23. The gate insulating layer 23 and the gate electrode layer 22 are integrally formed. Or in other words, the gate insulating layer 23 and the gate electrode layer 22 belong to a same metal layer originally; a surface of the metal layer is oxidized to form the gate insulating layer 23; and the remaining part becomes the gate electrode layer 22. Because the gate insulating layer 23 and the gate electrode layer 22 are integrally formed, the gate insulating layer 23 and the gate electrode layer 22 make direct contact and firm connection with each other, so that there are fewer gaps or defects between the gate insulating layer 23 and the gate electrode layer 22, and hence the insulating effect can be greatly improved. Moreover, the gate insulating layer 23 may also be manufactured to be very thin. For instance, a thickness of the gate insulating layer 23 may be from 50 nm to 400 nm, from 50 nm to 200 nm or from 80 nm to 160 nm. The substrate 10 may employ a flexible substrate. For instance, a material of the flexible substrate may be polyethylene naphthalate (PEN), polyethylene terephthalate (PET), polyimide (PI) or metal foil. Materials of the source electrode 41 and the drain electrode 42 are conductive materials, may be metallic materials such as aluminum, copper, molybdenum, titanium, silver, gold, tantalum, tungsten, chrome elements or aluminum alloy, may be metal oxide such as ITO and AZO, and may also be a multilayer film formed by several above films, with a total thickness of 100 nm-2,000 nm.

As illustrated in FIG. 3, another embodiment of the present invention provides a TFT. The difference between the TFT in the present embodiment and the TFT as shown in FIG. 2 is that the pattern of the semiconductor active layer 32 is the same as the pattern of the gate insulating layer 23.

Description will be given below to the present invention with reference to several embodiments.

First Embodiment

A metal oxide TFT, the structure of which is as shown in FIG. 2, comprises a substrate 10, a gate electrode 22, a gate insulating layer 23, an active layer 33, a source electrode 41 and a drain electrode 42. The manufacturing method thereof comprises the following steps:

a. As shown in FIG. 1a, forming an aluminum or tantalum metal film layer 20 with a thickness from 100 nm to 1,000 nm on the substrate 10 by a DC sputtering method.

b. As shown in FIG. 1b, forming a zinc or tin metal film layer 30 with a thickness from 10 nm to 200 nm on the aluminum or tantalum film by a DC sputtering method.

c. As shown in FIG. 1c, forming an aluminum or tantalum metal film layer 21 and a zinc or tin metal film layer 31 by simultaneously patterning the aluminum or tantalum metal film layer 20 and the zinc or tin metal film layer 30.

d. As shown in FIG. 1d, performing electrochemical oxidation, completely oxidizing the zinc or tin metal film layer to form a zinc oxide or tin oxide film layer 32, partially oxidizing the aluminum or tantalum metal film layer to form an aluminum oxide or tantalum oxide film layer on an upper surface functioning as a gate insulating layer 23 (with a thickness from 50 nm to 400 nm), and an unoxidized part of the aluminum or tantalum metal film layer functions as a gate electrode 22 (with a thickness from 100 nm to 800 nm).

e. As shown in FIG. 1e, forming an active layer 33 by patterning the zinc oxide or tin oxide film layer 32.

f. As shown in FIG. 2, forming an electrode layer by a DC sputtering method, and forming the source electrode 41 and the drain electrode 42 by patterning the electrode layer.

The electrochemical oxidation process of the step d is that: one end of a substrate immersing into an electrolytic solution is connected with a power supply anode, and a power supply cathode is connected with a graphite electrode or a metal electrode immersing into the electrolytic solution and is electrified for oxidation.

For instance, an etching barrier layer may also be disposed on the oxide active layer 32, so as to avoid the damage on the oxide active layer in the process of etching the source/drain electrodes. A passivation layer may also be disposed on the source/drain electrodes 41/42.

The substrate may be a glass substrate or a flexible substrate, and may also include a water-oxygen barrier layer or a buffer layer.

When the substrate is a flexible substrate, for example, the flexible substrate may be a polyethylene naphthalate (PEN), polyethylene terephthalate (PET), polyimide (PI) or metal foil flexible substrate.

The materials of the source electrode 41 and the drain electrode 42 in the step f may be metallic materials such as aluminum, copper, molybdenum, titanium, silver, gold, tantalum, tungsten, chrome elements or aluminum alloy, or may be metal oxide such as ITO and AZO, or may be a multilayer film formed by several above films, with the total thickness from 100 nm to 2,000 nm.

The manufacturing method provided by the first embodiment of the present invention does not require RF sputtering, has the advantages of non-radiation, low cost and good uniformity and repetitiveness, manufactures the TFT at room temperature, and meanwhile, can reduce oxygen vacancy and control the free carrier concentration. Moreover, the manufactured TFT has good stability.

Second Embodiment

A metal oxide TFT, the structure of which is shown in FIG. 2, comprises a substrate 10, a gate electrode 22, a gate insulating layer 23, an active layer 33, a source electrode 41 and a drain electrode 42. The manufacturing method thereof comprises the following steps:

a. As shown in FIG. 1a, forming a tantalum metal film layer 20 with a thickness of 500 nm on a glass substrate 10 by a DC sputtering method.

b. As shown in FIG. 1b, forming a zinc metal film layer 30 with a thickness of 40 nm on the tantalum metal film layer 20 by a DC sputtering method.

c. As shown in FIG. 1c, forming a tantalum metal film layer 21 and a zinc metal film layer 31 by simultaneously patterning the tantalum metal film layer 20 and the zinc metal film layer 30.

d. As shown in FIG. 1d, performing electrochemical oxidation, completely oxidizing the zinc metal film layer 31 to form a zinc oxide film layer 31, partially oxidizing the tantalum metal film layer 21 to form a tantalum oxide film layer on an upper surface functioning as the gate insulating layer 23 (with a thickness of 200 nm), and an unoxidized part of the tantalum metal film layer 21 functions as the gate electrode 22 (with a thickness of 300 nm).

e. As shown in FIG. 1e, forming an active layer 33 by patterning the zinc oxide film layer 32.

f. As shown in FIG. 2, forming a molybdenum electrode layer by a DC sputtering method, and forming a source electrode 41 and a drain electrode 42 by patterning the molybdenum electrode layer.

The electrochemical oxidation process of the step d is that: one end of a substrate immersing into a citrate electrolytic solution is connected with a power supply anode, and a power supply cathode is connected with a graphite electrode or a metal electrode immersing into the electrolytic solution and is electrified for oxidation.

The manufacturing method provided by the second embodiment of the present invention does not require RF sputtering, has the advantages of non-radiation, low cost and good uniformity and repetitiveness, manufactures the TFT at room temperature, and meanwhile, can reduce oxygen vacancy and control the free carrier concentration. Moreover, the manufactured TFT has good stability.

Third Embodiment

A metal oxide TFT, the structure of which is as shown in FIG. 2, comprises a substrate 10, a gate electrode 22, a gate insulating layer 23, an active layer 33, a source electrode 41 and a drain electrode 42. The manufacturing method thereof comprises the following steps:

a. As shown in FIG. 1a, forming an aluminum metal film layer 20 with a thickness of 300 nm on a flexible substrate 10 by a DC sputtering method, wherein, a material of the flexible substrate 10 is polyethylene naphthalate (PEN).

b. As shown in FIG. 1b, forming a tin metal film layer 30 with a thickness of 30 nm on the aluminum metal film layer 20 by a DC sputtering method.

c. As shown in FIG. 1c, forming an aluminum metal film layer 21 and a tin metal film layer 31 by simultaneously patterning the aluminum metal film layer 20 and the tin metal film layer 30.

d. As shown in FIG. 1d, performing electrochemical oxidation, completely oxidizing the tin metal film layer 31 to form a tin oxide film layer 32, partially oxidizing the aluminum metal film layer 21 to form an aluminum oxide film layer on an upper surface functioning as the gate insulating layer 23 (with a thickness of 200 nm), and an unoxidized part of the aluminum metal film layer functions as a gate electrode 22 (with a thickness of 100 nm).

e. As shown in FIG. 1e, forming a active layer 33 by patterning the tin oxide film layer 32.

f. Forming a molybdenum electrode layer by a DC sputtering method, and forming a source electrode 41 and a drain electrode 42 by patterning the molybdenum electrode layer.

The electrochemical oxidation process of the step d is that: one end of a substrate immersing into a citrate electrolytic solution is connected with a power supply anode, and a power supply cathode is connected with a graphite electrode or a metal electrode immersing into the electrolytic solution and is electrified for oxidation.

The manufacturing method provided by the third embodiment of the present invention does not require RF sputtering, has the advantages of non-radiation, low cost and good uniformity and repetitiveness, manufactures the TFT at room temperature, and meanwhile, can reduce oxygen vacancy and control the free carrier concentration. Moreover, the manufactured TFT has good stability.

What are described above is related to the illustrative embodiments of the disclosure only and not limitative to the scope of the disclosure; the scopes of the disclosure are defined by the accompanying claims.

The present application claims the priority of the Chinese Patent Application No. 201610076318.7 filed on Feb. 3, 2016, which is incorporated herein by reference as part of the disclosure of the present application.

What is claimed is:

1. A manufacturing method of a thin-film transistor (TFT), comprising:
   depositing metal film layers on a substrate by a direct current (DC) sputtering method, wherein the depositing the metal film layers on the substrate by the DC sputtering method comprises: depositing a first metal film layer on the substrate by a first DC sputtering method; and depositing a second metal film layer on the first metal film layer by a second DC sputtering method; and
   subsequent to depositing the first metal film and the second metal film, forming a metal oxide film layer or metal oxide film layers by completely oxidizing or partially oxidizing the metal film layers to obtain a remaining metal film layer and at least two metal oxide film layers stacked on the remaining metal film layer, wherein the forming the metal oxide film layer or metal oxide film layers by completely oxidizing or partially oxidizing the metal film layers comprises: completely oxidizing the second metal film layer to form a second metal oxide film layer; oxidizing a surface of the first metal film layer to form a first metal oxide film layer and obtain an unoxidized part of the first metal film layer as a third metal film layer, in which the first metal oxide film layer covers the third metal film layer.

2. The method according to claim 1, wherein, after depositing the metal film layers on the substrate by the DC sputtering method and before forming the metal oxide film layer or metal oxide film layers by completely oxidizing or partially oxidizing the metal film layers, further comprising:
   patterning the metal film layers.

3. The method according to claim 1, wherein, after forming the metal oxide film layer or metal oxide film layers by completely oxidizing or partially oxidizing the metal film layers, further comprising:
   patterning the metal oxide film layer or metal oxide film layers.

4. The method according to claim 1, after forming the metal oxide film layer or metal oxide film layers by completely oxidizing or partially oxidizing the metal film layers, further comprising:
   patterning the second metal oxide film layer.

5. The method according to claim 1, wherein a temperature of the substrate is the same as ambient temperature.

6. The method according to claim 1, wherein the first metal film layer comprises aluminum, tantalum, titanium or alloy of any two or three of aluminum, tantalum and titanium.

7. The method according to claim 1, wherein the second metal film layer comprises zinc, tin, indium or alloy of any two or three of zinc, tin and indium.

8. The method according to claim 1, wherein the third metal film layer is a gate electrode layer; the first metal oxide film layer is a gate insulating layer; and the second metal oxide film layer is an active layer.

9. The method according to claim 1, wherein the substrate is a flexible substrate.

10. The method according to claim 9, wherein the flexible substrate comprises polyethylene naphthalate (PEN), polyethylene terephthalate (PET), polyimide (PI) or metal foil.

11. The method according to claim 1, wherein a thickness of the third metal film layer is from 100 nm to 1,000 nm; a thickness of the second metal film layer is from 10 nm to 200 nm; and a thickness of the first metal oxide film layer is from 50 nm to 400 nm.

12. The method according to claim 1, further comprising: forming a water-oxygen barrier layer or a buffer layer on a side opposite to the metal film layers.

13. The method according to claim 12, wherein the water-oxygen barrier layer or the buffer layer comprises silicon oxide, silicon nitride, silicon oxynitride or alumina.

14. The method according to claim 1, wherein the oxidizing a surface of the first metal film layer further comprises:
   oxidizing the surface of the first metal film layer through a single oxidizing operation to form the first metal oxide film layer and obtain the unoxidized part of the first metal film layer as the third metal film layer, and the first metal oxide film layer covers an upper surface and side surfaces of the third metal film layer.

15. The method according to claim 1, wherein the first metal oxide film layer is sandwiched between the second metal oxide film layer and the third metal film layer.

16. The method according to claim 1, wherein the first metal oxide film layer covers an upper surface and side surfaces of the third metal film layer.

* * * * *